(12) United States Patent
Shin

(10) Patent No.: US 7,977,184 B2
(45) Date of Patent: Jul. 12, 2011

(54) METHOD FOR FABRICATING MIM STRUCTURE CAPACITOR

(75) Inventor: ChoNG-Hoon Shin, Siheung-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 281 days.

(21) Appl. No.: 12/334,500

(22) Filed: Dec. 14, 2008

(65) Prior Publication Data

US 2009/0162987 A1 Jun. 25, 2009

(30) Foreign Application Priority Data

Dec. 24, 2007 (KR) .......... 10-2007-0136744

(51) Int. Cl.
*H01L 21/8242* (2006.01)

(52) U.S. Cl. .. 438/253; 438/396; 438/957; 257/E21.646

(58) Field of Classification Search .......... 438/253–256, 438/396–399, 957; 257/E21.646
See application file for complete search history.

(56) References Cited

U.S. PATENT DOCUMENTS

| | | | | |
|---|---|---|---|---|
| 6,451,665 B1 * | 9/2002 | Yunogami et al. | ............ | 438/397 |
| 6,924,207 B2 * | 8/2005 | Son et al. | ............ | 438/396 |
| 6,927,142 B2 * | 8/2005 | Lee et al. | ............ | 438/396 |
| 7,279,382 B2 * | 10/2007 | Jo | ............ | 438/254 |

* cited by examiner

*Primary Examiner* — Richard A. Booth

(74) *Attorney, Agent, or Firm* — Sherr & Vaughn, PLLC

(57) ABSTRACT

A method for fabricating a metal/insulator/metal (MIM) structure capacitor includes forming a nitride film that is an insulating layer on a bottom electrode metal layer; forming titanium/titanium nitride (Ti/TiN) that is a top electrode metal layer on the nitride film; coating photo-resist on the top electrode metal layer and patterning a photo-resist layer; selectively etching the top metal electrode layer so that the nitride film remains using the patterned photo-resist layer as an etching mask and using the nitride film as an end point; and removing the remaining nitride film.

17 Claims, 3 Drawing Sheets

METHOD FOR FABRICATING MIM STRUCTURE CAPACITOR

Figure 1A:
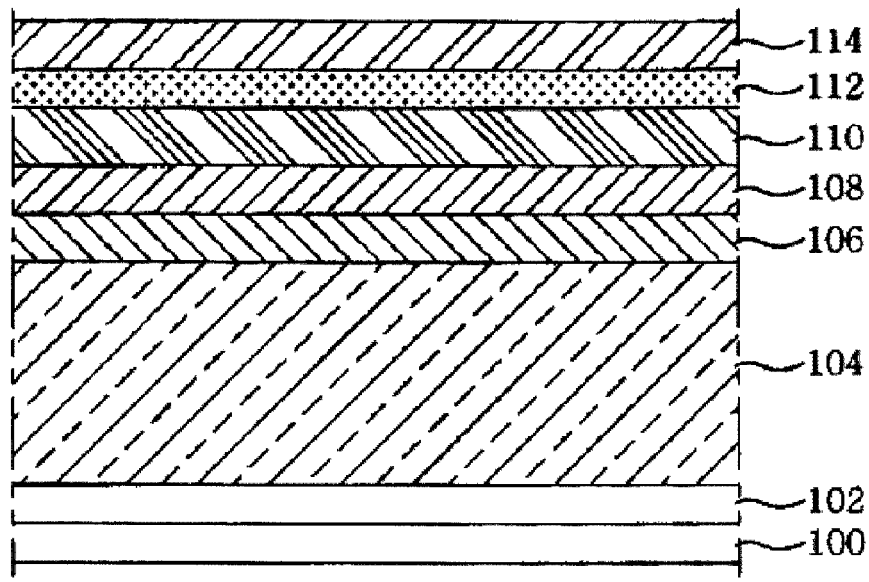

The present application claims priority under 35 U.S.C. 119 to Korean Patent Application No. 10-2007-0136744 (filed on Dec. 24, 2007), which is hereby incorporated by reference in its entirety.

BACKGROUND

Generally, capacitors used in a semiconductor device can be categorized as either a poly insulator poly (PIP) capacitor or a metal/insulator/metal (MIM) capacitor, based on its structure. Each of these types of capacitors has peculiar properties and is appropriate selected and used based on the properties of an associated semiconductor device. For example, the MIM structure capacitor may be used in a semiconductor device operating at high frequencies.

In a PIP structure capacitor, a top electrode and a bottom electrode may be formed of conductive polysilicon. Therefore, an oxidation reaction can occur between the top electrode and bottom electrode, and an insulator thin film interface, causing a problem that the capacitance of the capacitor may be reduced. In contrast, the MIM structure capacitor has small resistivity and no parasitic capacitance due to internal depletion, making its possible capacity potentially greater. In other words, a high frequency semiconductor device may use a MIM structure capacitor with metal having good electrical properties in order to prevent the operation of the device from being affected by an undesired RC delay.

SUMMARY

Embodiments relate to a method for fabricating a metal/insulator/metal (MIM) structure capacitor which prevents, or reduces, shorts generated by titanium/titanium nitride (Ti/TiN) attached to the side wall of the MIM capacitor when a patterning process is performed for forming the MIM structure capacitor. Embodiments provide a method for fabricating a MIM structure capacitor which prevents, or reduces, titanium/titanium nitride (Ti/TiN) from remaining on the side wall of the MIM capacitor by applying a chemical dry etching (CDE) process to the MIM capacitor when the MIM capacitor is patterned.

Embodiments relate to a method for fabricating a metal/insulator/metal (MIM) structure capacitor that includes: depositing a nitride film that is an insulating layer on a bottom electrode metal layer and titanium/titanium nitride (Ti/TiN) that is a top electrode metal layer on a bottom electrode metal layer in sequence for forming the MIM structure capacitor; coating photo-resist on the top electrode metal layer and patterning a photo-resist layer, selectively etching titanium/titanium nitride (Ti/TiN) that is the top metal electrode layer so that the nitride film remains using the patterned photo-resist layer as an etching mask and using the nitride film as an end point, and removing the remaining nitride film.

According to embodiments, when selectively etching the top metal electrode layer so that the nitride film remains, etching may be performed through a chemical dry etching (CDE) process. The nitride film may, for example, be etched by about 10% of the entire thickness through over-etching. Also, in the step of removing the remaining nitride film, the nitride film may be removed through a wet etching such as, for example, by using H3PO4. According to embodiments, the chemical dry etching (CDE) process may be performed when the MIM capacitor is patterned to prevent, or reduce, titanium/titanium nitride (Ti/TiN) from remaining on the side wall of the MIM capacitor, making it possible to improve the properties of the MIM structure capacitor.

DRAWINGS

Figure 1B:
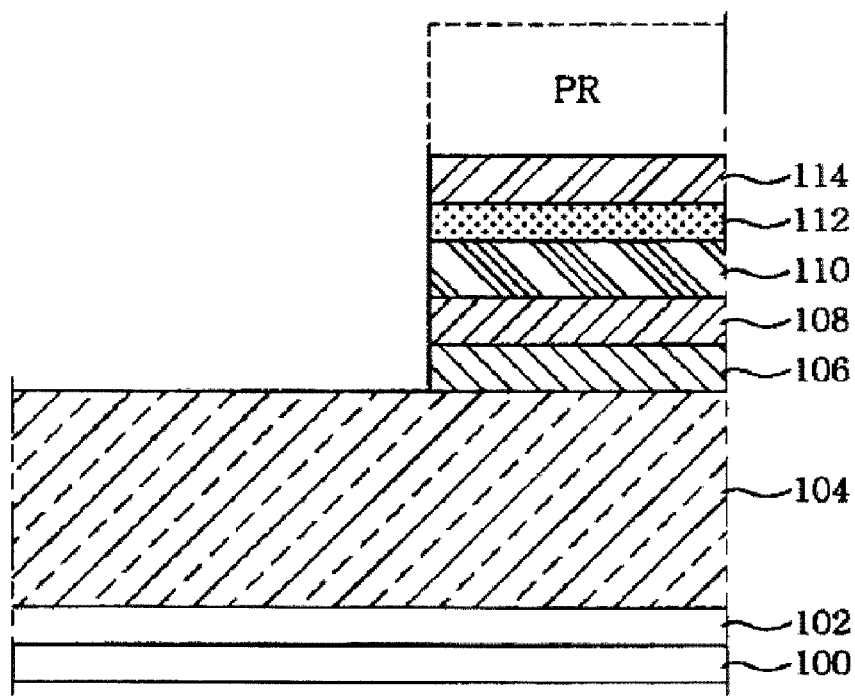

Example FIGS. 1A and 1B are cross-sectional views showing processes of a metal insulator metal (MIM) capacitor according to embodiments.

Figure 2A:
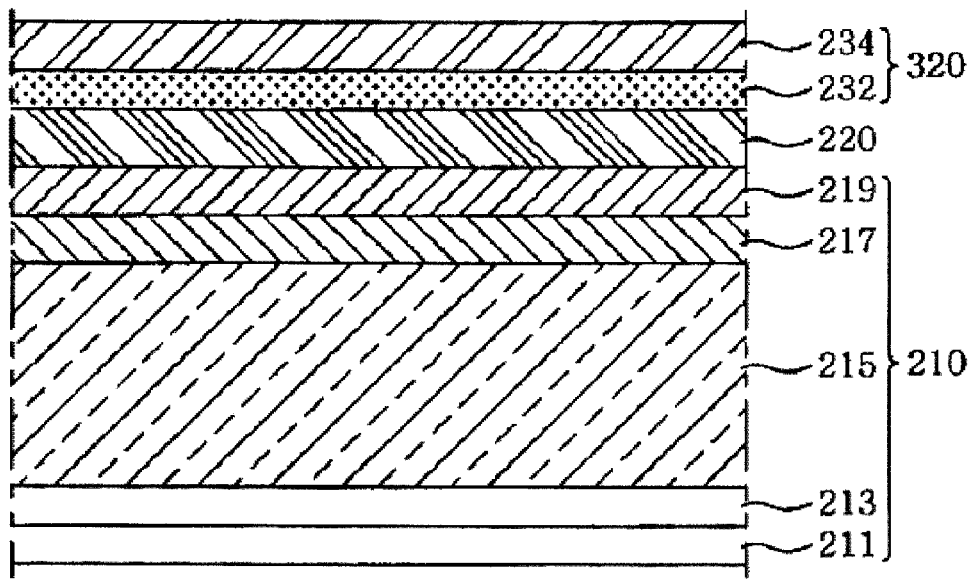
Figure 2B:
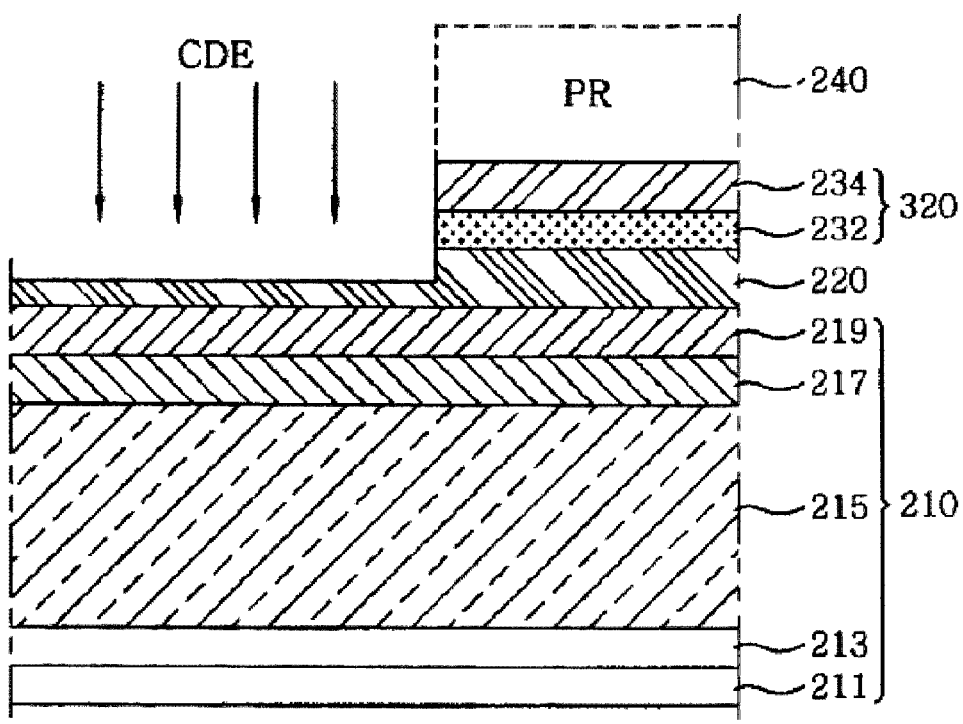
Figure 2C:
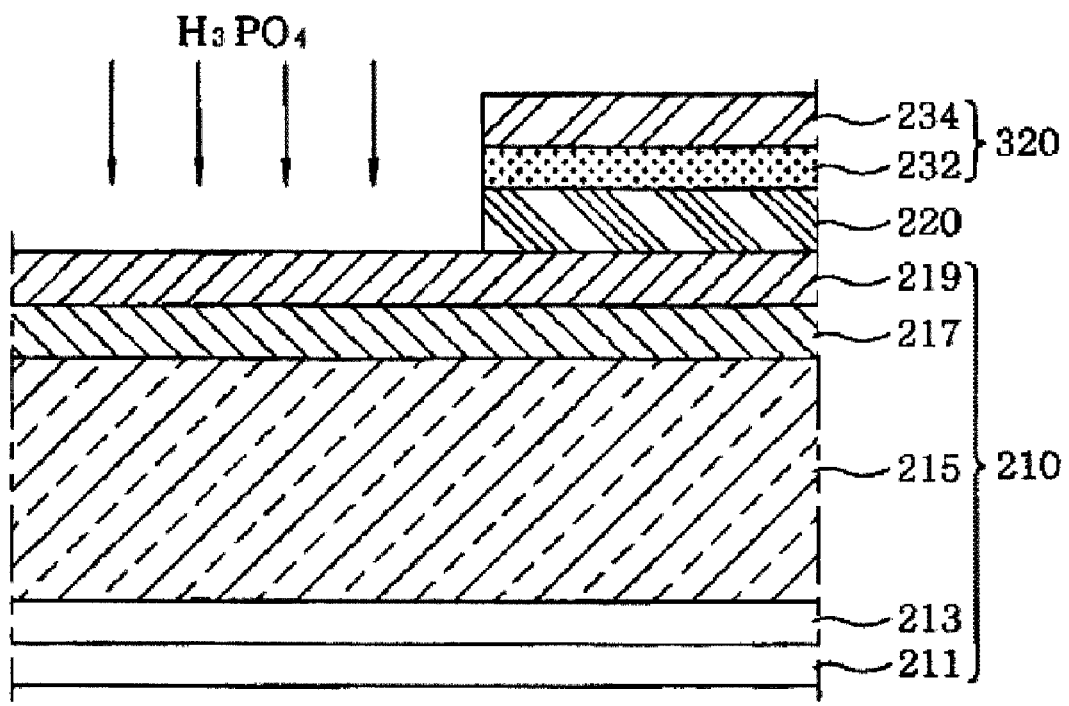

Example FIGS. 2A to 2C are cross-sectional views showing processes of a MIM capacitor according to embodiments.

DESCRIPTION

Example FIG. 1A is a cross-sectional view showing processes of a metal insulator metal (MIM) capacitor according to embodiments. As shown in example FIG. 1A, when forming a MIM structure, a bottom electrode metal layer may be formed. The bottom electrode metal layer may, for example, be formed by stacking titanium/titanium nitride (Ti/TiN) 100 and 102, aluminum copper (AlCu) 104 and titanium/titanium nitride (Ti/TiN) 106 and 108. A nitride film 110 insulating layer may be formed on, or over, the bottom electrode metal layer. Thereafter, titanium/titanium nitride (Ti/TiN) to become a top electrode metal layer may be deposited on, or over, the nitride film 110. Other functionally equivalent materials for each layer of the MIM structure are contemplated as well.

A photo-resist may then be coated on, or over, the top electrode metal layer and patterned. Using the patterned photo-resist layer as an etching mask, the top electrode metal layer 112 and 114 and the nitride film 110 may be etched to form a MIM structure. The etching may, for example, be a reactive ion etching (RIE) process.

However, it may be difficult to selectively etch the nitride film 110 when the top electrode metal layer is patterned, if a dry etching is performed. Therefore, when the nitride film 110 is relatively thin, the nitride film may itself also be inadvertently etched. Also, the titanium/titanium nitride (Ti/TiN) 106 and 108 of the bottom electrode metal layer may be etched as well and attach to the side wall of the MIM capacitor, as shown in example FIG. 1B, potentially causing a short.

Example FIGS. 2A to 2C are cross-sectional views showing processes of a MIM capacitor according to embodiments. A method for fabricating the MIM structure according to embodiments includes depositing a nitride film insulating layer on, or over, a bottom electrode metal layer and a top electrode metal layer to form the MIM structure capacitor; coating photo-resist on, or over, the top electrode metal layer and patterning a photo-resist layer; selectively etching the top metal electrode layer so that at least a portion of the nitride film remains using the patterned photo-resist layer as an etching mask and using the nitride film as an end point; and removing the remaining nitride film.

First, referring to example FIG. 2A, a bottom electrode metal layer 210 that may include, for example, two titanium layers (211 and 217) and two titanium nitride layers (213 and 219), and aluminum copper (AlCu) 215 may be deposited such as, for example, through a sputtering process. Thereafter, a nitride film 220 may be deposited on, or over, the bottom electrode metal layer 210 as an insulating layer of the MIM structure capacitor. A top electrode metal layer 230 that may include, for example, one titanium/titanium nitride (Ti/TiN) layer (232 and 234) may be formed on, or over, the nitride film 220.

Thereafter, as shown in example FIG. 2B, a photo-resist may be coated on, or over, the top electrode metal layer 230 and a photo-resist layer 240 may be patterned. Using the patterned photo-resist layer 240 as an etching mask; sequential etching may be performed while allowing the titanium/titanium nitride (Ti/TiN) 232 and 234 and the nitride film 220 to be end points. As mentioned previously, if the etching is performed all the way to titanium/titanium nitride (Ti/TiN) 217 and 219 (the bottom electrode metal layer 210) a short is more likely to occur. Accordingly, the etching may be controlled so that the titanium/titanium nitride (Ti/TiN) 232 and 234 (the top electrode metal layer 320) may be etched. The etching may, for example, be performed through a chemical dry etching (CDE) process.

In addition to etching away the top electrode metal layer 320, the nitride film 220 may be etched through over-etching. For example, the nitride film 220 may be over-etched by about 10% of its entire thickness. As a result, shorts between the top electrode and low electrode may be prevented, or reduced, by the remaining nitride film 220.

According to embodiments, the bottom electrode metal layer 210 may be formed at a thickness of about 4500 Å to about 5500 Å. While, Ti/TiN films 232 and 234 of the top electrode metal layer 230 may be formed at a thickness of about 500 Å and about 1500 Å, respectively. The photo-resist layer 240 that is the mask may, for example, be formed at a thickness of about 12000 Å to about 14000 Å and the nitride film 220 that remains may have a thickness of about 500 Å to about 550 Å.

Referring to example FIG. 2C, the nitride film 220 remaining on the bottom electrode metal layer 210 may be removed. The nitride film 220 may be removed, for example, through a wet etching. According to embodiments, the remaining nitride film 220 may be removed, for example, using H3PO4.

Therefore, when fabricating a MIM structure according to embodiments, titanium/titanium nitride (Ti/TiN) 232 and 234 of the top electrode metal layer 230 may be etched through a chemical dry etching (CDE) process with the remaining nitride film 220 that was over-etched may be removed through a wet etching. The properties of the MIM structure capacitor may thereby be improved because the etching process may be stably performed, making it possible to improve productivity of the MIM structure capacitor and increase process margins of subsequent processes.

It will be obvious and apparent to those skilled in the art that various modifications and variations can be made in the embodiments disclosed. Thus, it is intended that the disclosed embodiments cover the obvious and apparent the modifications and variations, provided that they are within the scope of the appended claims and their equivalents.

What is claimed is:

1. A method for fabricating a metal/insulator/metal structure capacitor including:
    forming a nitride film insulating layer over a bottom electrode metal layer;
    forming titanium/titanium nitride as a top electrode metal layer over the nitride film;
    coating photo-resist over the top electrode metal layer and patterning a photo-resist layer;
    selectively etching the top electrode metal layer and the nitride film through a chemical dry etching process using the patterned photo-resist layer as an etching mask, wherein the nitride film is etched by a predetermined portion of its entire thickness; and
    removing a remaining portion of the nitride film by a wet etching process.

2. The method according to claim 1, wherein selectively etching the top electrode metal layer includes using the nitride film as an end point.

3. The method according to claim 1, wherein selectively etching the top electrode metal layer comprises etching the nitride film by between about 9 to about 11% of its entire thickness.

4. The method according to claim 1, wherein the nitride film is removed by $H_3PO_4$.

5. A method for fabricating a metal/insulator/metal structure capacitor including:
    forming a first metal layer over a semiconductor substrate;
    forming a dielectric layer over the first metal layer;
    forming a second metal layer over the dielectric layer;
    forming a mask over the second metal layer;
    etching the second metal layer and performing a first etching on the dielectric layer to remove the dielectric layer by a predetermined portion of its entire thickness using the etching mask, wherein the first etching is a chemical dry etching process; and
    performing second etching on the dielectric layer to remove a remaining portion of the dielectric layer, wherein the second etching is a wet etching process.

6. The method according to claim 5, wherein the second metal layer comprises a titanium/titanium nitride film.

7. The method according to claim 5, wherein the dielectric layer on which the first etching is performed includes a step structure.

8. The method according to claim 5, wherein performing the second etching on the dielectric layer comprises etching the dielectric layer using $H_3PO_4$.

9. The method according to claim 5, wherein the first etching process includes etching the nitride film by between about 9 to about 11% of its entire thickness.

10. The method according to claim 5, wherein the dielectric layer comprises a nitride film.

11. The method according to claim 5, wherein the first metal layer includes at least one titanium/titanium nitride film.

12. The method according to claim 5, wherein the first metal layer includes at least a pair of titanium/titanium nitride films.

13. The method according to claim 12, wherein the first metal layer includes a sandwiched metal layer between the at least a pair of titanium/titanium nitride films.

14. The method according to claim 5, wherein the first metal layer has a thickness of about 5000Å.

15. The method according to claim 5, wherein the dielectric layer has a thickness of about 550Å.

16. The method according to claim 5, wherein the second metal layer has a thickness of about 2000Å.

17. A method for fabricating a metal/insulator/metal structure capacitor comprising:
    forming a nitride film insulating layer over a bottom electrode metal layer;
    forming titanium/titanium nitride as a top electrode metal layer over the nitride film;
    coating photo-resist over the top electrode metal layer and patterning a photo-resist layer;
    selectively etching the top electrode metal layer and etching the nitride film by between about 9-11% of its entire thickness using a chemical dry etching process and using the patterned photo-resist layer as an etching mask; and then
    removing the at least a portion of the nitride film remaining using a wet etching process.

* * * * *